(12) United States Patent
Dennerlein et al.

(10) Patent No.: US 11,792,951 B2
(45) Date of Patent: Oct. 17, 2023

(54) SUBRACK ASSEMBLY, ASSOCIATED RACK AND ASSEMBLY METHOD

(71) Applicant: FRAMATOME, Courbevoie (FR)

(72) Inventors: Jürgen Dennerlein, Erlangen (DE); Norman Kaun, Erlangen (DE); Michael Goth, Erlangen (DE)

(73) Assignee: FRAMATOME, Courbevoie (FR)

( * ) Notice: Subject to any disclaimer, the term of this patent is extended or adjusted under 35 U.S.C. 154(b) by 280 days.

(21) Appl. No.: 16/969,064

(22) PCT Filed: Feb. 13, 2018

(86) PCT No.: PCT/IB2018/000978
§ 371 (c)(1),
(2) Date: Aug. 11, 2020

(87) PCT Pub. No.: WO2019/158962
PCT Pub. Date: Aug. 22, 2019

(65) Prior Publication Data
US 2021/0037669 A1    Feb. 4, 2021

(51) Int. Cl.
*H05K 7/14* (2006.01)
(52) U.S. Cl.
CPC .................. *H05K 7/1425* (2013.01)
(58) Field of Classification Search
CPC .... H05K 7/142; H05K 7/1425; H05K 7/1411; H05K 7/023; H05K 7/20572;
(Continued)

(56) References Cited

U.S. PATENT DOCUMENTS

| 4,899,892 A | * | 2/1990 | Rheault | H02B 1/54 |
| | | | | 211/72 |
| 5,142,447 A | * | 8/1992 | Cooke | H05K 9/0016 |
| | | | | 361/741 |

(Continued)

FOREIGN PATENT DOCUMENTS

| CN | 1051262 A | 5/1991 |
| CN | 200944310 Y | 9/2007 |

(Continued)

OTHER PUBLICATIONS

Corresponding Search Report for PCT/IB2018/000978.

*Primary Examiner* — Patrick D Hawn
(74) *Attorney, Agent, or Firm* — Davidson, Davidson & Kappel, LLC (57) ABSTRACT

A subrack assembly (1) comprising a subrack (3) comprising two top rails (9), two bottom rails (7) and side elements (5), at least one rigidifying frame (21) comprising a front crossbeam, a rear crossbeam and two side beams; and at least one connector (70) for connecting the rigidifying frame (21) to the top and/or bottom of the subrack (3), comprising at least one movable block movable in translation relative to the rigidifying frame (21) between an insertion position, in which it is spaced away from the subrack (3) and a use position, in which it bears against the subrack (3). The connector (70) is configured for connecting the rigidifying frame (21) to the top and/or bottom of the subrack (3) such that the front and rear crossbeams each extend substantially parallel to a top or bottom rail (7, 9) of the subrack (3) and in alignment therewith along a vertical direction.

22 Claims, 7 Drawing Sheets

(58) Field of Classification Search
CPC .. H05K 7/1418; H05K 9/0016; H05K 9/0062; H05K 5/0065; H05K 5/0204
See application file for complete search history.

(56) References Cited

U.S. PATENT DOCUMENTS

| | | | |
|---|---|---|---|
| 5,305,187 A * | 4/1994 | Umezu | H05K 7/1425 |
| | | | 361/829 |
| 5,683,001 A | 11/1997 | Masuda et al. | |
| 6,100,468 A * | 8/2000 | Niggl | H05K 7/1447 |
| | | | 174/559 |
| 6,293,637 B1 * | 9/2001 | Anderson | H02B 1/54 |
| | | | 312/265.4 |
| 6,318,091 B1 * | 11/2001 | Varone | B01D 8/00 |
| | | | 257/E23.096 |
| 6,434,018 B1 * | 8/2002 | Waltz | H05K 7/1425 |
| | | | 312/265.6 |
| 6,447,082 B1 * | 9/2002 | Haag | H05K 7/1425 |
| | | | 312/263 |
| 6,474,480 B2 | 11/2002 | Negishi | |
| 6,561,602 B1 * | 5/2003 | Sevier | H02B 1/54 |
| | | | 312/257.1 |
| 6,951,288 B2 * | 10/2005 | Henderson | H05K 7/183 |
| | | | 361/829 |
| 7,007,809 B2 * | 3/2006 | Greenside | H05K 7/1425 |
| | | | 211/183 |
| 7,426,111 B2 * | 9/2008 | Sonobe | H05K 7/20572 |
| | | | 361/695 |
| 9,370,118 B2 * | 6/2016 | Li | H05K 7/1409 |
| 10,064,309 B2 * | 8/2018 | Chen | H05K 7/20209 |
| 10,201,115 B2 * | 2/2019 | Johnson | H05K 7/20772 |
| 10,959,348 B1 * | 3/2021 | Qualters | H05K 5/0226 |
| 2002/0044430 A1 | 4/2002 | Negishi | |
| 2002/0064035 A1 * | 5/2002 | Mair | H05K 9/0062 |
| | | | 361/800 |
| 2002/0179552 A1 | 12/2002 | Marraffa | |
| 2003/0174474 A1 | 9/2003 | Mair et al. | |
| 2007/0119792 A1 | 5/2007 | Hendrix et al. | |
| 2007/0144993 A1 | 6/2007 | Knoop | |
| 2008/0000849 A1 | 1/2008 | Zhang et al. | |
| 2021/0195802 A1 * | 6/2021 | Peterson | G06F 1/206 |

FOREIGN PATENT DOCUMENTS

| | | |
|---|---|---|
| CN | 103309403 A | 9/2013 |
| DE | 102015121193 B4 | 7/2017 |
| JP | H0625574 A | 9/1994 |
| JP | H06252574 A | 9/1994 |
| JP | 2004014638 A | 1/2004 |
| JP | 2015211052 A | 11/2015 |
| RU | 164421 U1 | 8/2016 |

* cited by examiner

SUBRACK ASSEMBLY, ASSOCIATED RACK AND ASSEMBLY METHOD

The present disclosure relates to a subrack assembly, intended to be mounted into an electronics rack, said subrack assembly comprising:
a subrack, intended for receiving electronic modules, said subrack comprising two top rails, two bottom rails and side elements, the top and bottom rails extending substantially parallel to one another and perpendicular to the side elements and connecting the side elements with each other.

BACKGROUND

In nuclear power plants, electronic equipment such as, for example, electronic modules relating to the instrumentation, automation and control systems are usually mounted in subracks, these subracks being in turn mounted in corresponding electronic equipment racks.

Since such nuclear reactors may be installed in seismic regions, it is important that the electronic equipment be protected in the case of a seism. Indeed, in the event of an earthquake, degradation or failure of the electronic equipment may have catastrophic consequences on the operation of the nuclear reactor.

SUMMARY

A purpose of the present disclosure is to improve the protection of electronic equipment, in particular in a nuclear power plant, in the case where the electronic equipment is subjected to high dynamic loads, and in particular in the event of an earthquake.

To this end, a subrack assembly as mentioned above is provided, further comprising:
at least one rigidifying frame comprising a front crossbeam, a rear crossbeam and two side beams connecting the front crossbeam to the rear crossbeam at their respective longitudinal ends; and
at least one connector for connecting the rigidifying frame to the top and/or to the bottom of the subrack, the connector comprising at least one movable block, which is movable in translation relative to the rigidifying frame between an insertion position, in which it is spaced away from the subrack and a use position, in which it bears against the subrack, the or each connector being configured for connecting the rigidifying frame to the top and/or to the bottom of the subrack such that the front and rear crossbeams each extend substantially parallel to a top or bottom rail of the subrack and in alignment therewith along a vertical direction.

According to particular embodiments, the subrack assembly according to the invention may comprise one or more of the following features, taken alone or according to any technically possible combination:
the distance between the front crossbeam and the rear crossbeam, taken perpendicular thereto, is greater than or equal to 90% of the distance between the top rails or the bottom rails of the subrack, and is advantageously smaller than or equal to the distance between the top rails or the bottom rails of the subrack;
the rigidifying frame further comprises at least one transversal strut, extending between the front crossbeam and the rear crossbeam, substantially perpendicular to the front and rear crossbeams and at a distance from the longitudinal ends of the front and rear crossbeams;
one transversal strut is a central transversal strut extending from the middle of the front crossbeam to the middle of the rear crossbeam, the rigidifying frame preferably further comprising two additional transversal struts extending between the front crossbeam and the rear crossbeam on either side of the central transversal strut;
the connector comprises a position adjustment screw and a position adjustment threaded hole formed in the movable block, the movable block being movable between its insertion position and its use position by screwing the position adjustment screw into the adjustment threaded hole or out of the adjustment threaded hole;
the connector further comprises a locking system, intended for locking the position of the movable block relative to the rigidifying frame, the locking system preferably comprising a locking hole formed in the movable block and a locking screw;
each connector comprises an upper movable block and a lower movable block, which are independently movable relative to the rigidifying frame in opposite directions, the upper movable block being configured for bearing against a bottom rail of a subrack located above the rigidifying frame in its use position and the lower movable block being intended for bearing against a top rail of a subrack located below the rigidifying frame;
each movable block is substantially L-shaped and comprises a foot portion comprising a bearing surface, intended for bearing against a corresponding surface of the subrack in the use position and a leg portion, extending substantially perpendicular to the foot portion, the leg portion bearing against a wall of the rigidifying frame;
the front crossbeam and/or the rear crossbeam comprises a tubular outer wall having a closed cross-section;
the front crossbeam and/or the rear crossbeam comprises at least one reinforcing rib extending inside the tubular outer wall;
the or each reinforcing rib extends diagonally between two diagonally opposed corners of the tubular outer wall;
the front crossbeam and/or the rear crossbeam comprises two reinforcing ribs, extending diagonally between diagonally opposed corners of the tubular outer wall so as to form a cross when viewed in cross-section perpendicular to the longitudinal direction of the corresponding crossbeam;
the subrack assembly further comprises a substantially V-shaped reinforcing structure, extending from the front crossbeam to the rear crossbeam;
the substantially V-shaped reinforcing structure comprises a first diagonal strut extending from a central region of a first one among the front and the rear crossbeam to a first longitudinal end of the other one among the front and the rear crossbeam and a second diagonal strut extending from a central region of the first one among the front and the rear crossbeam to the second longitudinal end of the other one among the front and the rear crossbeam.

A rack comprising a rack frame and a subrack assembly as mentioned above is also provided.

According to particular embodiments, the rack according to the invention may comprise one or more of the following features, taken alone or according to any technically possible combination:

- the rack frame defines reception spaces, each reception space being intended for receiving a subrack of the subrack assembly and reception zones, each reception zone being intended for receiving a rigidifying frame of the subrack assembly, the reception spaces and reception zones being arranged in alternating fashion along the vertical direction on the rack frame and wherein the rack comprises at least one subrack of the subrack assembly mounted in a reception space and at least one rigidifying frame of the subrack assembly mounted in a reception zone adjacent to the subrack above or below the subrack;
- the movable block of the or each connector of the subrack assembly occupies its use position, in which the movable block bears against the subrack;
- for the or each subrack, the rack comprises a rigidifying frame connected to the top of the subrack and a rigidifying frame connected to the bottom of the subrack through respective connectors, the movable block of the or each connector being in its use position, in which the movable block bears against the subrack;
- the rack comprises at least two subracks, mounted in adjacent reception spaces of the rack frame, a common rigidifying frame being arranged in the reception zone located between the subracks, the rigidifying frame being connected both to the upper and to the lower subrack through the connectors, the movable block of the or each connector being in its use position, in which the movable block bears against a corresponding subrack.

A method for assembling a rack as mentioned above is also provided, comprising the steps of:

- providing a rack frame comprising reception spaces and reception zones;
- mounting a subrack and a rigidifying frame, respectively in a subrack reception space and in an adjacent reception zone of the rack frame, located above or below the reception space, the movable block of each connector being in the insertion position;
- displacing the movable block of the or each connector from its insertion position to its use position so that it bears against the corresponding subrack.

BRIEF DESCRIPTION OF THE DRAWINGS

The invention will be better understood upon reading the following description, given only by way of example and with reference to the appended drawings, wherein.

DETAILED DESCRIPTION

In the following, the words "top" and "bottom" are used with respect to the normal orientation of the subrack assembly when inserted into a corresponding rack.

In the figures, an (x,y,z) frame has been represented, where the z-axis extends along the vertical direction, i.e. in the bottom-top direction of the subrack assembly or of the rack, and (x,y) defines a horizontal plane. More particularly, the x-axis extends along the length of the subrack assembly or the rack and the y-axis extends in the direction of the depth of the subrack assembly or rack, i.e. from the front to the back of the subrack assembly.

The longitudinal direction of the beam is the direction extending parallel to its longitudinal axis.

The front of the subrack assembly 1 is preferably the side of the assembly 1 from which the electronic modules are inserted into the subrack 3.

Figure 1:
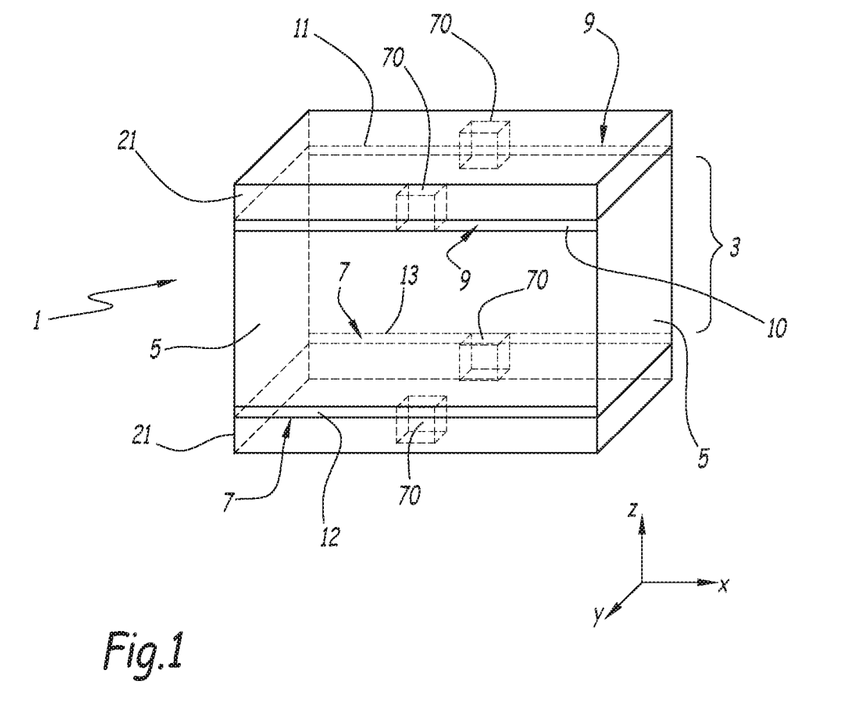
FIG. 1 is a perspective schematic view of a subrack assembly according to a first embodiment.

FIG. 1 schematically illustrates a subrack assembly 1 according to a first embodiment.

The subrack assembly 1 comprises a subrack 3. More particularly, the subrack 3 comprises two facing side elements 5, extending substantially parallel to each other, two bottom rails 7 and two top rails 9. The bottom and top rails 7, 9 connect the two side elements 5 with each other, respectively at the top and at the bottom end thereof. They extend substantially parallel to one another and perpendicular to the side elements 5. The side elements 5 are, in particular, side plates. However, each side element 5 may also be formed by two parallel struts.

More particularly, the top rails 9 comprise a front top rail 10, and a rear top rail 11. The front top rail 10 connects the top front ends of the side elements 5 with each other, while the rear top rail 11 connects the top rear ends of the side elements 5 with each other.

Similarly, the bottom rails 7 comprise a front bottom rail 12 and a rear bottom rail 13. The front bottom rail 12 connects the bottom front ends of the side elements 5 with each other, while the rear bottom rail 13 connects the bottom rear ends of the side elements 5 with each other.

The bottom and top rails 7, 9 are connected to the side elements 5 at their longitudinal ends, taken along the longitudinal direction thereof, through any adequate connection means, and for example by screwing or welding.

The subrack 3 is intended for receiving electronic modules. More particularly, the electronic modules are for example inserted between the bottom and top rails 7, 9 along an insertion direction that is perpendicular to the longitudinal direction of the bottom and top rails 7, 9, such that they extend substantially parallel to the side elements 5 of the subrack assembly 1 in their inserted position.

The subrack 3 is intended to be attached to a rack frame through the attachment of the side elements 5 to a vertical support structure of the rack frame, for example through screwing. For this purpose, the subrack 3 comprises subrack attachment means, which are intended to cooperate with corresponding attachment means formed on the rack frame. For example, the subrack attachment means comprise subrack attachment brackets, which may be located at the corners of the subrack 3, the attachment brackets including connection holes which are intended to cooperate with corresponding holes formed in the vertical support structure of the rack frame. The connection between the subrack 3 and the rack frame is in particular obtained by inserting a connection means, for example a bolt or a screw, through the corresponding connection holes.

In the example shown in FIG. 1, the subrack 3 is a conventional subrack.

The subrack assembly 1 further comprises at least one rigidifying frame 21, which is intended to be connected to the top and/or to the bottom of the subrack 3. The rigidifying frame 21 is shown more particularly in FIGS. 2 and 3.

Figure 2:
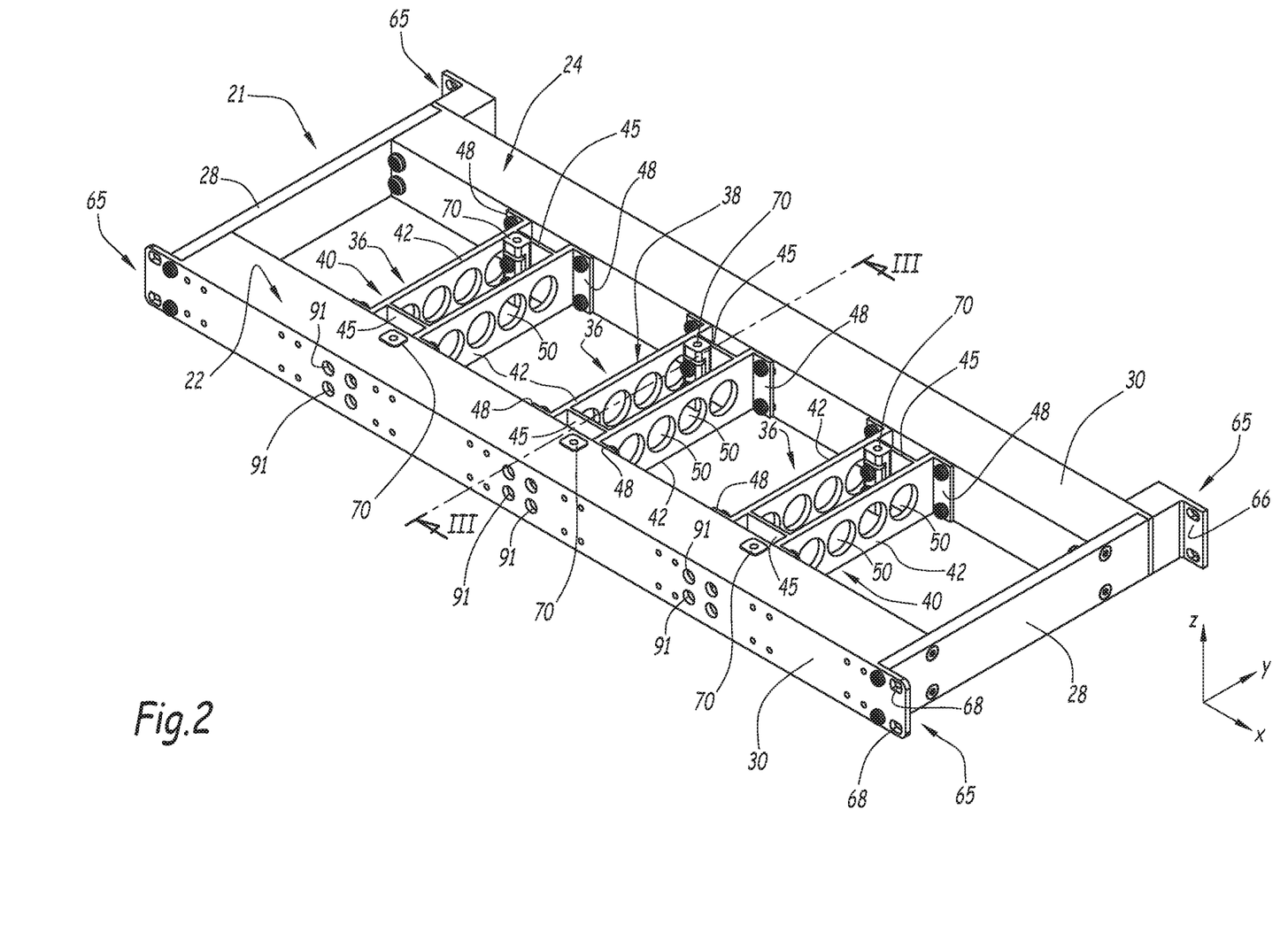
FIG. 2 is a perspective view of a rigidifying frame of the subrack assembly of FIG. 1.

As shown in FIG. 2, the rigidifying frame 21 comprises a front crossbeam 22, a rear crossbeam 24 and two side beams 28, connecting the front and rear crossbeam 22, 24 to one another. The front crossbeam 22, rear crossbeam 24 and side beams 28 define a substantially rectangular opening therebetween.

The front and the rear crossbeams 22, 24 extend substantially parallel to each other. They further extend substantially parallel to the bottom and top rails 7, 9 of the subrack 3.

Each side beam 28 extends between two facing longitudinal ends of the front and rear crossbeams 22, 24. It is connected to the front and rear crossbeams 22, 24 respectively at its front longitudinal end and at its rear longitudinal end. The side beams 28 are connected to the front and rear crossbeams 22, 24 through any adequate connection means, and in particular through screwing or welding.

The distance between the front crossbeam 22 and the rear crossbeam 24 is preferably chosen in such a way that it is greater than or equal to 90% of the distance between the top rails 9 or between the bottom rails 7 of the subrack 3. Preferably, the distance between the front crossbeam 22 and the rear crossbeam 24 is substantially equal to the distance between the top rails 9 or between the bottom rails 7 of the subrack 3. Such a distance is in particular advantageous in the case where a ventilation in a vertical direction is required through the subrack 3 for cooling the subrack 3. Indeed, in this case, a ventilation shaft is formed between the bottom rails 7 and the top rails 9. Providing a rigidifying frame 21 having the above-mentioned dimensions allows maintaining a sufficient airflow through the subrack 3.

The stiffness of the rigidifying frame 21 is preferably such that the resonance frequencies of the subrack assembly 1 without its payload are different from the resonance frequencies of the rack frame receiving the subrack assembly 1 and/or of the payload received in the subrack(s) 3. Preferably, the resonance frequencies of the subrack assembly 1 and those of the rack frame receiving the subrack assembly 1 and/or of the payload received in the subrack(s) 3 are not multiples of one another. In this manner, the risk that the subrack assembly 1 resonates together with the rack frame and/or the payload received in the subrack(s) 3 of the subrack assembly 1 is small.

In this context, the stiffness includes the bending stiffness and the torsional stiffness.

The payload is the electronic equipment received in the subrack(s) 3, for example the electronic modules received in the subrack 3.

Preferably, the stiffness of the rigidifying frame 21 is such that the resonance frequencies of the subrack assembly 1 including its payload are well separated from each other.

The stiffness of the rigidifying frame 21 is advantageously such that the resonance frequencies of the subrack assembly 1 including its payload are strictly greater than the excitation frequency spectra which may be observed in the environment in which the subrack assembly 1 is intended to be located.

For example, in the nuclear field, seismic or plane crash excitation frequencies of up to 40 Hz can be observed in the Y-direction and of up to 60 Hz in the Z-direction.

For example, the desired stiffness of the rigidifying frame 21 is obtained by adjusting the stiffness, in particular the bending stiffness and the torsional stiffness, of the front and/or rear crossbeam 22, 24.

The desired bending stiffness of the front and/or rear crossbeam 22, 24 may in particular be obtained by providing the front crossbeam 22 and/or the rear crossbeam 24 with a cross-sectional profile, taken in a plane normal to the longitudinal direction of the considered crossbeam, configured for improving its bending stiffness.

Figure 3:
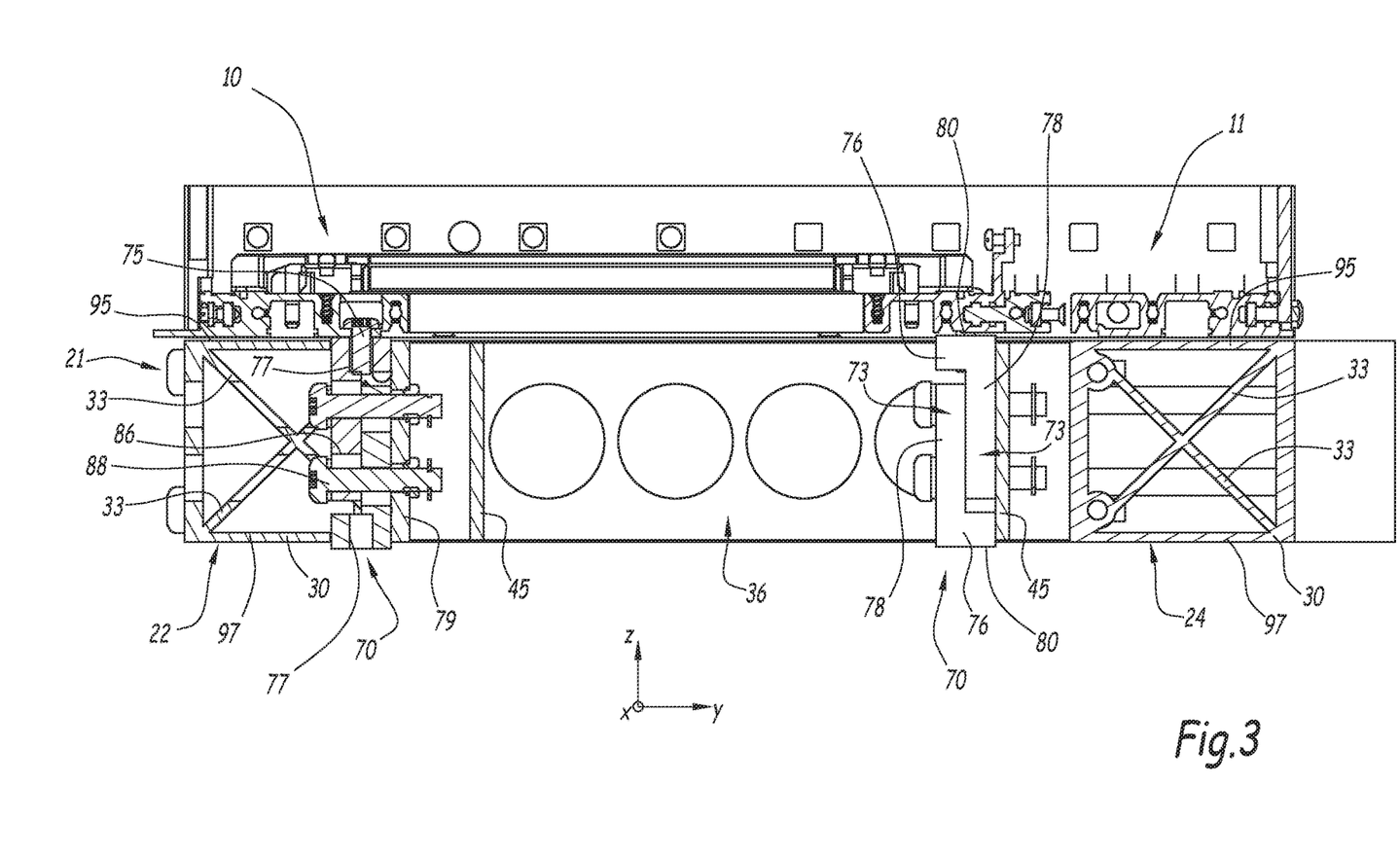
FIG. 3 is a cross-sectional view of the rigidifying frame of FIG. 2, taken along the plane III in FIG. 2.

Preferably, and as shown more particularly in FIG. 3, the front crossbeam 22 is a profiled strut comprising a tubular outer wall 30 having a closed cross-section. In the example shown in FIGS. 1 to 5, the tubular outer wall 30 has a substantially rectangular cross-section. However, any other cross-section might be used depending on the needs in terms of bending stiffness.

Preferably, and as shown in FIGS. 1 to 5, the front crossbeam 22 further comprises at least one reinforcing rib 33 extending inside the tubular outer wall 30 from the front of the tubular wall 30 to the rear thereof.

Preferably, each rib 33 extends over the entire length of the front crossbeam 22.

In the example shown in FIGS. 1 to 5, the front crossbeam 22 comprises at least one reinforcing rib 33 extending diagonally between two diagonally opposed corners of the tubular outer wall 30. More particularly, in this example, the front crossbeam 22 comprises two reinforcing ribs 33, each reinforcing rib 33 extending diagonally between diagonally opposed corners of the tubular outer wall 30 so as to form a cross when viewed in cross-section, taken perpendicular to the longitudinal direction of the corresponding crossbeam 22. Such a rib arrangement results in a particularly high increase in bending stiffness. However, a different rib arrangement might be used depending on the needs in terms of bending stiffness.

In the example shown in FIGS. 1 to 5, the rear crossbeam 24 has a structure that is identical to that of the front crossbeam 22.

The desired torsional stiffness of the rigidifying frame 21 is in particular obtained by adjusting the torsional stiffness of the front and/or rear crossbeams 22, 24.

In the example shown in FIGS. 1 to 5, a high torsional stiffness of the front and/or rear crossbeams 22, 24 is obtained through the use of a closed cross-sectional profile for these crossbeams 22, 24 and through the presence of the diagonal reinforcing rib(s) 33.

In the example shown in FIGS. 1 to 5, the rigidifying frame 21 further comprises at least one transversal strut 36 extending between the front crossbeam 22 and the rear crossbeam 24, substantially perpendicular to the front and rear crossbeams 22, 24 and at a distance from the longitudinal ends of the front and rear crossbeams 22, 24. The presence of such a transversal strut 36 further increases the stiffness of the rigidifying frame 21 in the front to back direction (Y-direction).

Preferably, one transversal strut 36 is a central transversal strut 38 extending from the middle of the front crossbeam 22, taken along the longitudinal direction thereof, to the middle of the rear crossbeam 24, taken along the longitudinal direction thereof.

In the example shown in FIGS. 1 to 5, the rigidifying frame 21 preferably further comprises two additional transversal struts 40, extending parallel to the central transversal strut 38 on either side thereof.

Preferably, the transversal struts 36 are regularly spaced along the length of the front and/or rear crossbeam 22, 24.

In particular, the distance between the central transversal strut 38 and each of the two adjacent additional struts 40 is identical.

According to an alternative, the transversal struts 36 are not regularly spaced along the length of the front and/or rear crossbeam 22, 24.

The number of transversal struts 36 is chosen depending on the desired stiffness of the rigidifying frame 21, the stiffness increasing with the number of transversal struts 36.

In the example shown in FIGS. 1 to 5, each transversal strut 36 comprises two substantially parallel side walls 42 extending substantially perpendicular to the front and rear crossbeams 22, 24. The side walls 42 are connected to each other by connecting walls 45. The connecting walls 45 extend substantially perpendicular to the side walls 42.

In this example, each transversal strut 36 further comprises lateral attachment flanges 48 extending from a respective side wall 42, and bearing against a respective crossbeam 22, 24. The lateral attachment flanges 48 are intended for attaching the transversal strut 36 to the front and rear crossbeams 22, 24.

In the example shown in FIGS. 1 to 5, each lateral flange 48 comprises at least one screw hole, receiving a screw for screwing the transversal strut 36 to the corresponding crossbeam 22, 24. However, the transversal struts 36 may also be attached to the crossbeams 22, 24 through another adapted attachment means, for example by welding.

Preferably, the side walls 42 comprise a plurality of through-holes 50. Such through-holes 50 are advantageous, since they decrease the total weight of the rigidifying frame 21, without significantly decreasing its stiffness. They further facilitate the circulation of air through the rigidifying frame 21.

The rigidifying frame 21 further comprises attachment means 65 for attachment of the rigidifying frame 21 to a rack frame. These attachment means 65 comprise, in the examples shown in the figures, attachment brackets 66 located at the corners of the rigidifying frame 21. Each attachment bracket 66 comprises at least one attachment hole 68, intended for receiving a corresponding attachment member, for example a bolt or a screw, for connecting the rigidifying frame 21 to the rack. In the example shown in FIG. 2, each attachment bracket 66 comprises two attachment holes 68. The attachment holes 68 are intended to cooperate with a corresponding hole formed in the rack frame, and more particularly in a vertical support structure thereof.

The subrack assembly 1 further comprises at least one connector 70 for connecting the rigidifying frame 21 to the top and/or to the bottom of the subrack 3.

Each connector 70 is configured for connecting the rigidifying frame 21 to the top and/or to the bottom of the subrack 3 such that the front and rear crossbeams 22, 24 thereof each extend substantially parallel to a bottom rail 7 or a top rail 9 of the subrack 3 and in alignment therewith along a vertical direction.

Advantageously the subrack assembly 1 comprises at least one connector 70 located at the front of the rigidifying frame 21, for connecting the rigidifying frame 21 to a front rail 10, 12 of the subrack 3 and at least one connector 70 located at the rear of the rigidifying frame 21, for connecting the rigidifying frame 21 to a rear rail 11, 13 of the subrack 3. In the example shown in FIG. 2, the subrack assembly 1 comprises two connectors 70 for each transversal strut 36.

The connector 70 is shown more particularly in FIG. 3.

Each connector 70 comprises at least one movable block 73, which is movable relative to the rigidifying frame 21 between an insertion position in which it is spaced apart from the corresponding subrack 3 and a use position in which it bears against the corresponding subrack 3. More particularly, the movable block 73 of the connector 70 is mounted on the rigidifying frame 21 so as to be slidable relative to the rigidifying frame 21. Advantageously, the movable block 73 is slidable along a vertical direction relative to the rigidifying frame 21.

As shown in FIG. 3, the connector 70 further comprises a position adjustment system configured for moving the movable block 73 between its insertion position and its use position. The position adjustment system is configured for adjusting the vertical position of the movable block 73 relative to the subrack 3.

In the example shown in FIG. 3, the position adjustment system comprises a position adjustment screw 75 and a position adjustment threaded hole 77 formed in the movable block 73.

The position adjustment system is configured in such a manner that the movable block 73 is movable between its insertion position and its use position by screwing the position adjustment screw 75 into the position adjustment threaded hole 77 or out of the position adjustment threaded hole 77.

As can be seen in FIG. 3, the position adjustment screw 75 extends through a through-hole provided in the corresponding bottom or top rail 7, 9 of the subrack 3 and extending in alignment with the position adjustment threaded hole 77, the head of the position adjustment screw 75 bearing against the rail 7, 9.

In FIG. 3, the position adjustment system has been shown only on the connector 70 located on the left in order to simplify the drawing. However, each connector 70 comprises such a position adjustment system.

In the example shown in FIGS. 1 to 5, the movable block 73 has an L-shape. It comprises a foot portion 76 and a leg portion 78, extending substantially perpendicular to the foot portion 76. More particularly, the foot portion 76 extends substantially horizontally, while the leg portion 78 extends substantially vertically.

The foot portion 76 delimits a bearing surface 80 configured for bearing against a corresponding subrack 3, and more particularly against a bottom or top rail 7, 9 thereof. The bearing surface 80 extends substantially horizontally. In this example, the position adjustment threaded hole 77 extends in the foot portion 76 of the movable block 73.

The leg portion 78 bears against a wall of the rigidifying frame 21. More particularly, in the example shown in FIGS. 2 and 3, the leg portion 78 of the front connector 70 (on the left in FIG. 3) bears against a rear wall 79 of the front crossbeam 22 and the leg portion 78 of the rear connector 70 (on the right in FIG. 3) bears against a wall of a transversal strut 36 extending substantially vertically parallel to the longitudinal direction of the front and/or rear crossbeam 22, 24, and more particularly against a connecting wall 45 of the transversal strut 36.

In the example shown in FIGS. 1 to 5, the connector 70 further comprises a locking system, configured for locking the movable block 73 in its use position relative to the rigidifying frame 21.

More particularly, the locking system comprises at least one locking hole 86 extending through the movable block 73 and through a portion of the rigidifying frame 21 and a locking screw 88, extending through the locking hole 86.

The locking system is configured in such a manner that the screwing of the locking screw 88 into the locking hole 86 presses the movable block 73, and more particularly the leg portion 78 thereof, against the corresponding wall of the rigidifying frame 21, thus locking the movable block 73 in position relative thereto.

The locking hole 86 has a central axis extending substantially perpendicular to the direction of displacement of the movable block 73. Advantageously, the axis of the locking hole 86 extends horizontally and perpendicular to the longitudinal direction of the front crossbeam 22, i.e. along the Y direction.

The portion of the locking hole 86 extending through the movable block 73 preferably has an elongated shape. The portion of the locking hole 86 extending through the portion of the rigidifying frame 21 is preferably threaded.

In FIG. 3, the locking system has been shown only on the connector 70 located on the left in order to simplify the drawing. However, each connector 70 comprises such a locking system.

Advantageously, and as shown in FIG. 2, the front crossbeam 22 comprises a tool passage through-hole 91, extending in alignment with the locking hole 86 of each movable block 73 along the Y-axis. Each tool passage through-hole 91 extends through the front wall and through the rear wall of the front crossbeam 22. In the case where the rigidifying frame 21 further comprises a connecting wall 45 extending between the front crossbeam 22 and the locking hole 86, the connecting wall 45 also comprises a tool passage through-hole extending in alignment with the locking hole 86 of each movable block 73 along the Y-axis. Thus, a screwdriver may be introduced through the tool passage through-holes from the front of the rigidifying frame 21, for locking both the front and the rear movable blocks 73 in position. It is therefore possible to lock the front and rear movable blocks 73 in position from the front of the rigidifying frame 21, without having to access the rear of the rigidifying frame 21, which is generally not readily accessible once assembled in the rack frame.

Advantageously, each connector 70 is bidirectional. In this context, bidirectional means that the connector 70 may be used for connecting the rigidifying frame 21 to a subrack 3 located above and/or to a subrack 3 located below the rigidifying frame 21.

For this purpose, in the embodiment shown in FIGS. 2 and 3, the movable block 73 comprises an upper movable block 73 and a lower movable block 73, which are independently movable relative to the rigidifying frame 21 in opposite directions. More particularly, the threads of the position adjustment threaded holes 77 in the upper and lower movable blocks 73 are formed in such a manner that the screwing of the position adjustment screw 75 into the upper movable block 73 results in an upwards displacement of this block 73, while the screwing of the position adjustment screw 75 into the lower movable block 73 results in a downward displacement of the movable block 73.

The upper and lower movable blocks 73 are identical, but are arranged head to tail. More particularly, the upper movable block 73 is arranged with its leg portion 78 pointing downwards, while the lower movable block 73 is arranged with its leg portion 78 pointing upwards. The leg portions 78 of the upper and lower movable blocks 73 bear against one another. As shown in FIG. 3, the leg portion 78 of a given movable block 73 may bear against the considered wall 79, 45 indirectly through the leg portion 78 of the other movable block 73 of the connector 70.

Each movable block 73 is associated with a corresponding locking screw 88 and locking hole 86 and with a corresponding position adjustment screw 75 and position adjustment threaded hole 77.

In the example shown in FIGS. 2 and 3, the top wall 95 and/or the bottom wall 97 of the front crossbeam 22 comprises a passage hole for the passage of the movable block 73 of the front connector 70 there-through during its displacement from its insertion towards its use position.

In this example, the rear connector 70 is located in front of the rear crossbeam 24.

The present disclosure also provide a rack 100 comprising at least one subrack assembly 1 as described above. The rack 100 will now be described in more detail with reference to FIGS. 4 and 5.

The rack 100 comprises a rack frame 102 (shown in FIG. 5) and at least one subrack assembly 1 assembled with the rack frame 102. For simplification purposes, the rack frame 102 has not been illustrated in FIG. 4.

Figure 5:
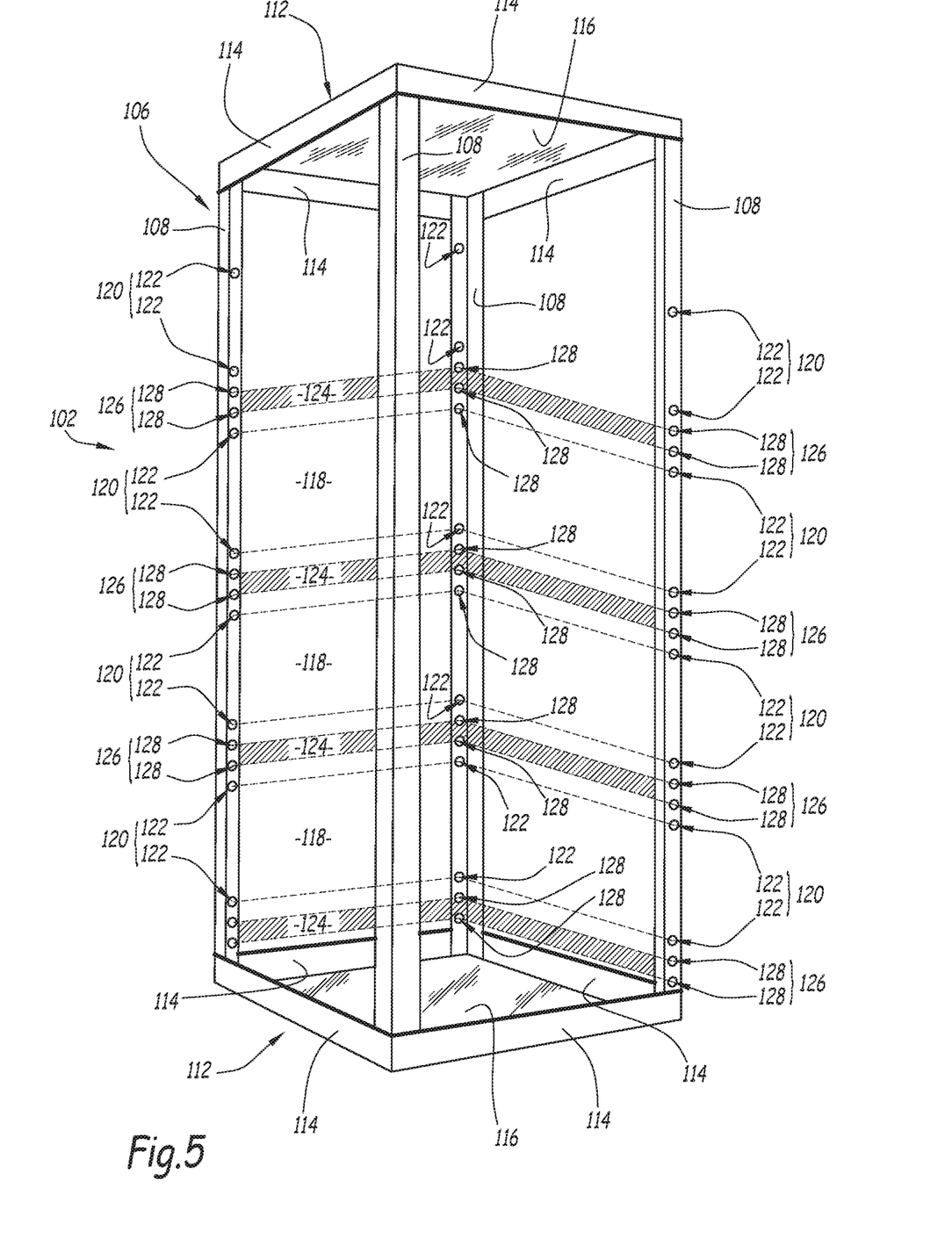
FIG. 5 is a schematic perspective view of a rack frame intended for receiving the subrack assemblies of FIG. 4.

The rack frame 102 comprises a vertical subrack support structure 106. For example, the vertical subrack support structure 106 may comprise vertical posts 108. According to an alternative which is not shown in the figures, the vertical subrack support structure 106 may comprise vertical walls.

The posts 108 or walls of the vertical subrack support structure 106 are connected to one another through a horizontal structure 112 at least at their top and bottom ends. The horizontal structure for example comprises horizontal beams 114 extending between the vertical posts 108 or walls. The horizontal structure 112 may further comprise a horizontal wall 116, extending between the horizontal beams 114. According to an alternative which is not shown in the figures, the horizontal structure 112 may comprise horizontal walls extending between the vertical posts 108 or walls.

The rack frame 102 may form a part of an electrical cabinet.

The rack frame 102 defines several vertically superposed subrack reception spaces 118.

More particularly, each subrack reception space 118 comprises rack frame attachment means 120 intended to cooperate with the subrack attachment means provided on the subracks 3 for attaching subracks 3 to the rack frame 102.

These attachment means 120 in particular comprise attachment holes 122 which are regularly spaced along the vertical direction. The attachment holes 122 are formed in the vertical subrack support structure 106, and for example in the vertical posts 108.

The spacing of the attachment holes 122 is chosen in such a manner that it corresponds to the vertical spacing between the attachment holes provided on the subrack 3.

The dimensions of the subracks 3 and of the attachment holes provided thereon are generally standardized such that any subrack 3 can be assembled with a given rack frame 102.

The subrack reception spaces 118 in the rack frame 102 are delimited by the attachment means 120. The positions of the subrack reception spaces 118 are determined by the spacing of the attachment holes 122.

The subrack 3 is attached to the rack frame 102 through a bolt or screw (not shown) inserted through the aligned attachment holes on the rack frame 102 and on the subrack 3.

The rack frame 102 further comprises at least one reception zone 124 for a rigidifying frame 21. More particularly, each reception zone 124 is located vertically above and/or below a subrack reception space 118, and for example between two adjacent subrack reception spaces 118. Preferably, the reception zones 124 and the subrack reception spaces 118 alternate along the vertical direction.

Each reception zone 124 advantageously comprises rigidifying frame attachment means 126 for the attachment of one rigidifying frame 21. These attachment means 126 are for example formed as attachment holes 128.

The reception zones 124 are delimited by the attachment means 126. The positions of the reception zones 124 are determined by the spacing of the attachment holes 128.

The rack 100 comprises at least one subrack 3 mounted in a subrack reception space 118 of the rack frame 102 and at least one rigidifying frame 21, mounted in the reception zone 124 of the rack frame 102 adjacent to the subrack reception space 118 where the subrack 3 is located. The reception zone 124 receiving the rigidifying frame 21 may be located above or below the subrack 3.

In FIG. 5, the subrack(s) 3 and rigidifying frame(s) 21 have not been represented in the rack frame 102 in order to simplify the drawing.

Figure 4:
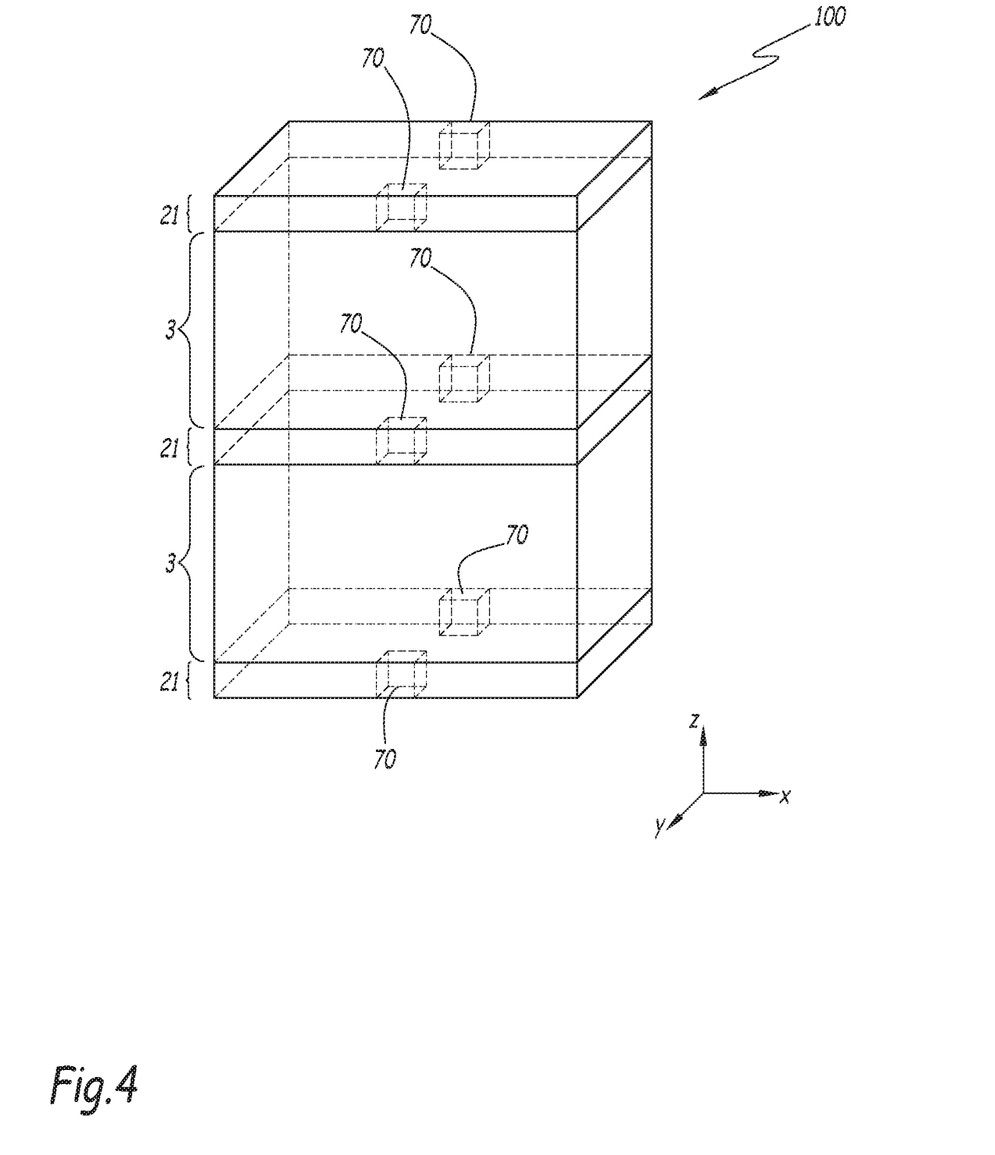
FIG. 4 is a schematic view of a plurality of superimposed subrack assemblies as shown in FIG. 1.

In the use configuration, the rigidifying frame 21 is connected to the subrack 3 through the or each connector 70. The movable block 73 of the or each connector 70 is in its use position, in which it bears against the subrack 3.

When the subrack(s) 3 and rigidifying frame(s) 21 are assembled with the rack frame 102, for each connector 70, the position adjustment screw 75 extends through a corresponding rail 7, 9 of the subrack 3 into the position adjustment threaded hole 77 of the movable block 73. The head of the screw bears against a surface of the corresponding rail 7, 9 located opposite the movable block 73.

Preferably, for each connector 70, at least one locking screw 88 extends through the locking hole 86 so as to lock the movable block 73 in position relative to the rigidifying frame 21.

Advantageously, for each subrack 3 arranged in a given reception space 118 of the rack frame 102, the rack 100 comprises a rigidifying frame 21 arranged in the reception zone 124 located immediately above the subrack reception space 118 and connected to the top of the subrack 3 through its connector(s) 70 and a rigidifying frame 21 arranged in the reception zone 124 located immediately below the subrack reception space 118 and connected to the bottom of the subrack 3 through the connector(s) 70.

Advantageously, and as shown schematically in FIG. 4, the rack 100 comprises at least two subracks 3, mounted in adjacent subrack reception spaces 118 of the rack frame 102. In this case, one common rigidifying frame 21 is arranged in the reception zone 124 located between the subracks 3, this rigidifying frame 21 being connected both to the upper and to the lower subrack 3 through the connector(s) 70.

In this case, one or each upper movable block 73 of the connector(s) 70 of the common rigidifying frame 21 is connected to a respective bottom rail 7 of the subrack 3 located immediately above the common rigidifying frame 21 and one or each lower movable block 73 of the connector(s) 70 of the common rigidifying frame 21 is connected to a respective top rail 9 of the subrack 3 located immediately below the common rigidifying frame 21.

The rack 100 may include as many subracks 3 as needed, a rigidifying frame 21 being interposed between each pair of vertically adjacent subracks 3 and connected thereto through connector(s) 70.

Advantageously, one bottommost rigidifying frame 21 is located above the topmost subrack 3 and connected to the top thereof through connector(s) 70 and/or one topmost rigidifying frame 21 is located below the bottommost subrack 3 and connected to the bottom thereof through connector(s) 70.

A method for assembling the rack 100 will now be explained.

This method comprises:
providing a rack frame 102 comprising subrack reception spaces 118 and reception zones 124 for rigidifying frames 21;
assembling a subrack 3 and a rigidifying frame 21 to the rack frame 102, the subrack 3 and the rigidifying frame being respectively located in a subrack reception space 118 and in a reception zone 124 of the rack frame 102, the movable block 73 of each connector 70 being in the insertion position;
displacing the movable block 73 of each connector 70 from its insertion position to its use position so that it bears against the subrack 3.

The step of displacing the movable block 73 advantageously comprises:
displacing the movable block 73 in translation relative to the rigidifying frame 21, towards the considered subrack 3, into its use position using the position adjustment system; and then
locking the position of the movable block 73 using the locking system.

For example, the movable block 73 displacement step comprises screwing a position adjustment screw 75 into the position adjustment threaded hole 77 of the movable block 73 so as to displace the movable block 73.

For example, the locking step comprises inserting a locking screw 88 through a locking hole 86 so as to lock the movable block 73 in position relative to the rigidifying frame 21.

In the case where rack 100 comprises several superposed subracks 3, preferably, all the rigidifying frames 21 are assembled with the rack frame 102 prior to mounting the subracks 3 therebetween.

Preferably, the movable blocks 73 of the connectors 70 are displaced into their use position only once all the subracks 3 and rigidifying frames 21 have been attached to the rack frame 102.

According to an alternative, the movable blocks 73 are displaced to their use position as soon as the corresponding pair consisting of a subrack 3 and a rigidifying frame 21 has been mounted in the rack frame 102.

The subrack assembly 1 and corresponding rack 100 are particularly advantageous.

Indeed, the low stiffness of the top and bottom rails 7, 9 of the subrack 3 in the front to back direction (Y-direction in the figures) and in the vertical direction (Z-direction in the figures) results in a low stiffness of the subrack 3, taken on its own, i.e. without the rigidifying frame 21, in these directions. Moreover, the stiffness in Y- and Z-direction of the subrack 3, taken on its own, can generally not be increased due to the boundary conditions at the installation location. This low stiffness in Y- and Z-directions results in low resonance frequencies of the subrack 3 in these directions, these resonance frequencies generally being around 50 Hz once the subrack 3 has been filled with its payload, i.e. with the electronic modules. In the nuclear field, excitation frequency spectra of up to 40 Hz can be observed in Y-direction and of up to 60 Hz in Z-direction for example due to a seism or an airplane crash. This means that the subracks 3 will be excited around their resonant frequencies, thus resulting in high amplitude resonant oscillations. This behavior of the subrack 3, when taken on its own, might result in a deterioration of the subracks 3 and of the electronic modules contained therein when subjected to high dynamic solicitations.

In the subrack assembly 1, the overall stiffness in Y-direction is significantly increased thanks to the presence of the rigidifying frame 21 and connectors 70, thus resulting in a significant increase in the resonant frequencies in these directions. Therefore, with the subrack assembly 1 and rack 100, the risk of deterioration in the case of high dynamic solicitations is much reduced.

In particular, in the rigidifying frame 21 as described above, the bending stiffness has been optimized while taking into account the spatial constraints relating to the implementation in a standard rack. In particular, due to the limited vertical space between adjacent subrack 3 attachment zones in a standard rack, it is not possible to improve the bending stiffness by increasing the height of the crossbeams 22, 24 indefinitely without loss of installation space for the subracks 3.

The provision of a front-to-back connection between the front and the rear crossbeams 22, 24, through the side beams 28 and the optional transversal struts 36 further improves the stiffness in the Y-direction.

Furthermore, the particular shape of the rigidifying frame 21 offers a very good compromise between the weight of the frame 21, which should be minimized, and the structural stiffness, which should be maximized.

The rigidifying frame 21 as disclosed above is in particular configured for resisting dynamic oscillations at frequencies comprised between 0 and 120 Hz, and in particular between 0 and 100 Hz.

The adjustable connectors 70 also contribute to improving the stiffness of the subrack assemblies 1 and of the rack 100 comprising these subrack assemblies 1, while at the same time providing for an easy mounting of the subracks 3 and rigidifying frames 21 in the rack frame 102. Indeed, the rigidifying frame(s) 21 and the subrack(s) 3 can be assembled separately into their corresponding reception spaces 118 or zones 124 on the rack frame 102 while the movable block 73 of each connector 70 is in its insertion position. Once the subrack(s) 3 and rigidifying frame(s) 21 have been assembled with the rack frame 102, the movable block 73 is moved into its use position, in which it abuts against the adjacent subrack 3, thus providing for an optimal connection between the subrack 3 and the adjacent rigidifying frame 21, despite the tolerances that might exist in the positions of the reception spaces 118 and reception zones 124 of the rack frame 102. The quality of the connection between the subrack 3 and the rigidifying frame 21 is important in order for the rigidifying frame 21 to optimally play its stiffening role.

The subrack assembly 1, corresponding rack and assembly method may advantageously be used in nuclear reactors, but also in avionic applications, such as in airplanes or in trains.

A subrack assembly 201 according to a second embodiment will now be described with reference to FIGS. 6 and 7.

The subrack assembly 201 according to the second embodiment differs from the subrack assembly 1 according to the first embodiment only by the structures of the rigidifying frame 221 and of the connector(s) 270.

In the following description and in the drawings, elements analogous to elements already described with reference to the first embodiment are designated with the same reference numeral incremented by 200. Only the differences between the second embodiment and the first embodiment will be described below. The subrack 3 and the rack frame 102 being identical in the first and second embodiments, the same reference numerals have been kept to designate these elements.

Figure 6:
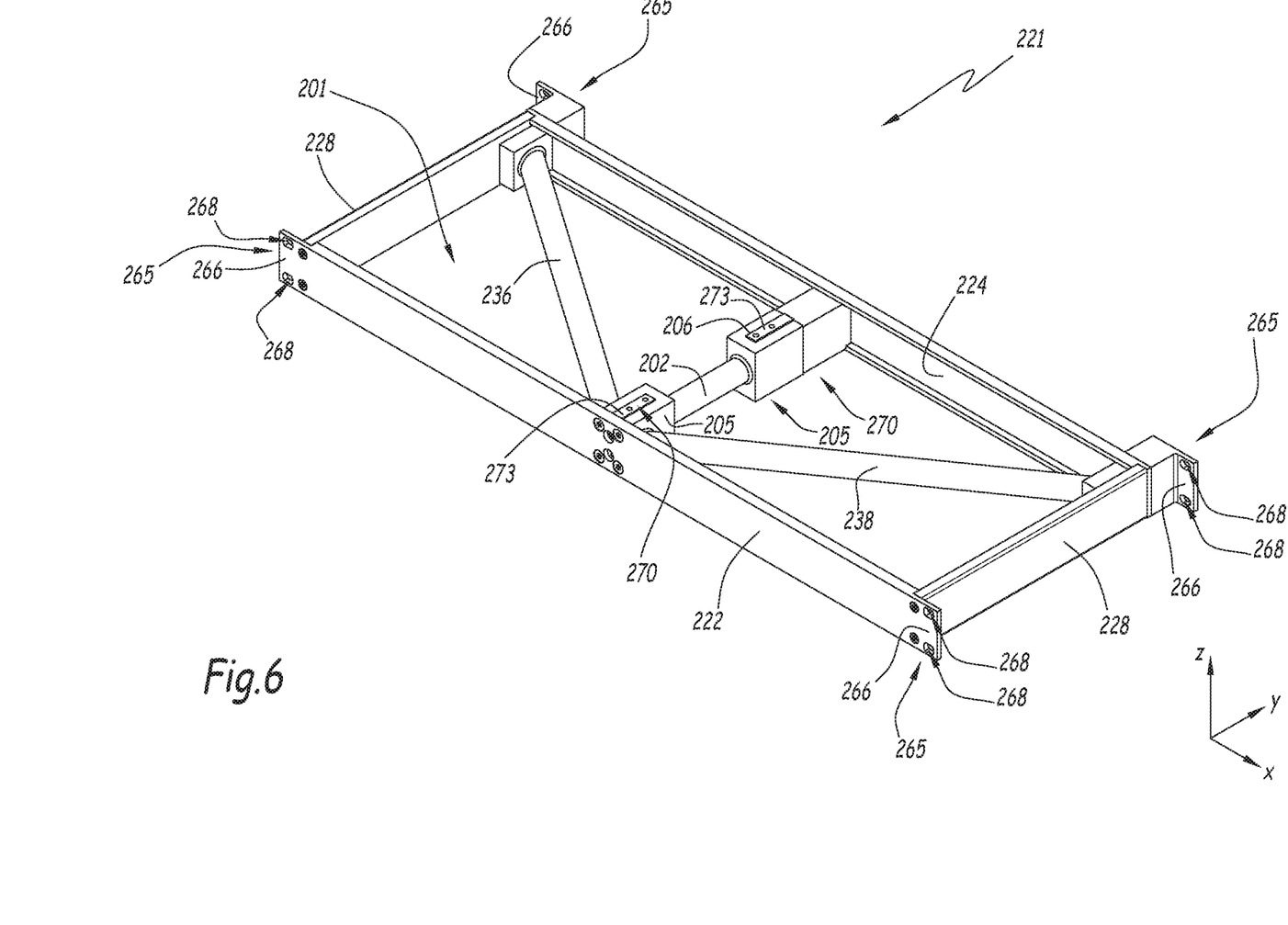
FIG. 6 is a perspective view of a rigidifying frame of a subrack assembly according to a second embodiment.

As shown in FIG. 6, the rigidifying frame 221 comprises a front crossbeam 222, a rear crossbeam 224 and two side beams 228, connecting the front and rear crossbeam 222, 224 to one another.

In the second embodiment, the front crossbeam 222 and/or the rear crossbeam 224 is formed by a profiled strut which does not have a closed cross-section. More particularly, it comprises a web 225, extending substantially vertically and at least one flange 226, extending from said web 225 at an angle relative to said web 225, and advantageously perpendicular to said web 225. Advantageously, the profiled strut comprises two flanges 226, extending from the web 225 at an angle, and advantageously perpendicular to said web 225.

For a considered crossbeam 222, 224, the flanges 226 for example extend from the web 225 towards the opposite crossbeam 222, 224.

For example, in the embodiment shown in FIG. 6, the front crossbeam 222 and the rear crossbeam 224 have a U-shaped cross-sectional profile. In this embodiment, the bottom of the U (corresponding to the web 225 of the profiled strut formed by the considered crossbeam) extends along a vertical plane containing the longitudinal direction of the considered crossbeam and the legs of the U (corresponding to the two flanges 226 of the profiled strut formed by the considered crossbeam 222, 224) extend perpendicular to the bottom of the U in a horizontal plane. For example, for a considered crossbeam 222, 224, the legs of the U extend from the bottom of the U towards the opposite crossbeam 222, 224.

The U-shape is only one example of a possible profile of the crossbeams 222, 224. Any other cross-sectional profile which improves the stiffness of the crossbeams 222, 224 in the vertical direction, for example an I-shape or a T-shape, can also be used.

In the example shown in FIG. 6, the rigidifying frame 221 further comprises a substantially V-shaped reinforcing structure 231 extending between the front crossbeam 222 and the rear crossbeam 224. This structure 231 comprises a first diagonal strut 239 extending from a central region of a first one among the front and the rear crossbeam 222, 224 to a first longitudinal end of the other one among the front crossbeam 222 and the rear crossbeam 224 and a second diagonal strut 241 extending from a central region of the first one among the front crossbeam 222 and the rear crossbeam 224 to the second longitudinal end of the other one among the front crossbeam 222 and the rear crossbeam 224.

In the example shown in FIG. 6, the diagonal struts 239, 241 have a circular cross-section. However, other cross-sections, such as, for example, a square or a rectangular cross-section may also be used.

In the example shown in FIG. 6, the first diagonal strut 239 extends from a central region of the front crossbeam 222 to a first longitudinal end of the rear crossbeam 224, while the second diagonal strut 241 extends from the central region of the front crossbeam 222 to the second longitudinal end of the rear crossbeam 224. Therefore, the reinforcing structure 231 forms a V having its vertex located in the central region of the front crossbeam 222.

More particularly, the first and second diagonal struts 239, 241 meet at a connection zone where they are connected to the front crossbeam 222. The connection zone is advantageously located in the middle of the corresponding crossbeam 222, 224, taken along the longitudinal direction thereof.

Optionally, the rigidifying frame 221 further comprises a transversal strut 236, extending between the front crossbeam 222 and the rear crossbeam 224, substantially perpendicular to the front and rear crossbeams 222, 224, and at a distance from the longitudinal ends thereof. Preferably, and as shown in FIG. 6, the transversal strut 236 extends from a central region of the front crossbeam 222 to a central region of the rear crossbeam 224. More particularly, it extends from the middle of the front crossbeam 222 to the middle of the rear crossbeam 224.

In the example shown in FIG. 6, the transversal strut 236 has a circular cross-section. Alternatively, other cross-sections, such as a square or rectangular cross-section may be used.

The transversal strut 236 intersects the V-shaped reinforcing structure 231 at its vertex. More particularly, the transversal strut 236 is located in a symmetry plane of the V-shaped reinforcing structure 231.

In the above description, the V-shaped reinforcing structure 231 has been described as having its vertex located at the front crossbeam 222. According to an alternative, the vertex may be located at the rear crossbeam 224. In this alternative, the features described with respect to the first configuration apply, "front" being replaced with "rear".

Figure 7:
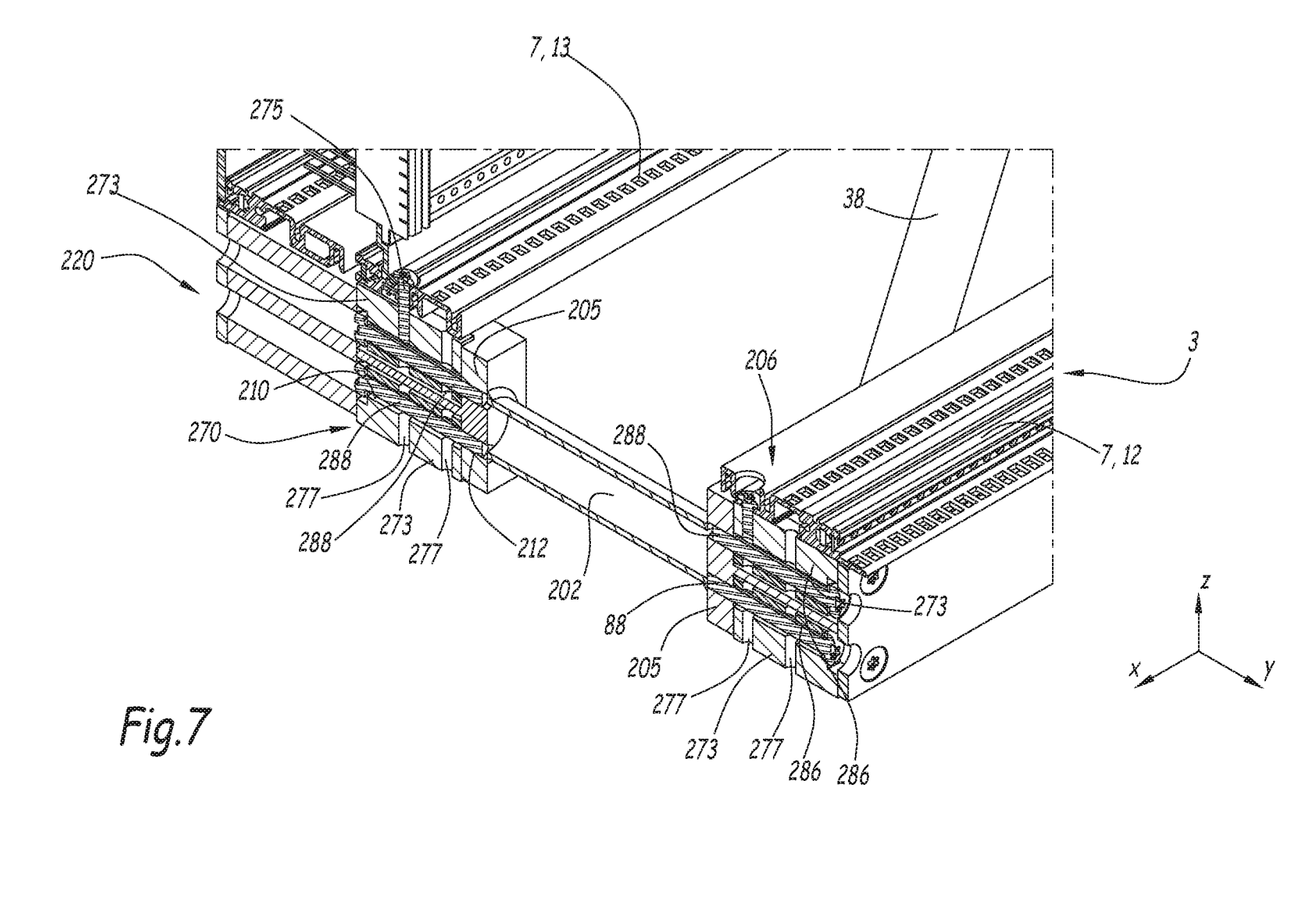
FIG. 7 is a perspective schematic view of a part of the subrack assembly of FIG. 6.

In the example shown in FIGS. 6 and 7, the rigidifying frame 221 comprises at least one connector 270, and more particularly two connectors 270. Preferably, the rigidifying frame 221 comprises at least one connector 270 located at the front of the rigidifying frame 221 and one connector located in the rear of the rigidifying frame 221.

Each connector 270 is preferably located in a central zone of the rigidifying frame 221, taken along the longitudinal direction of the crossbeams 222, 224. In the example shown in FIG. 6, each connector 270 is located in the vertical medial plane of the rigidifying frame 221. It is more particularly located in the vertical medial plane of the front and rear crossbeams 222, 224.

In the example shown in the figures, the subrack assembly 1 according to the second embodiment comprises at least one connector 270 located at the vertex of the V-shaped reinforcing structure 231.

In the example shown in the figures, the or each movable block 273 of the connector(s) 270 has a parallelepiped shape.

In this embodiment, the movable block 273 is received in a reception block 205 of the rigidifying frame 221 so as to be slidable relative thereto in a vertical direction. More particularly, the movable block 273 is received in a reception and guiding slot 206 formed in the reception block 205. This slot 206 has a shape that is complementary to that of the movable block 273. It opens out vertically towards the corresponding subrack 3. In the example shown in the figures, the slot 206 is closed at its end opposite its open end. The side walls of the slot 206 are configured for guiding the translation of the movable block 273.

In the insertion position of the connector 270, shown in FIG. 6, the movable block 273 extends entirely in the slot 206, the top surface of the movable block 273 being flush with the top surface of the reception block 205. In the use position of the connector 270, the movable block 273 extends partially outside of the slot 206, through the opening thereof.

In the embodiment shown in FIGS. 6 and 7, the position adjustment system comprises, for each movable block 273, two adjacent position adjustment threaded holes 277 extending there-through. Each position adjustment threaded hole 277 extends along a substantially vertical axis. The position adjustment threaded holes 277 of a considered movable block 273 are spaced apart along a direction perpendicular to the longitudinal direction of the crossbeams 222, 224 (Y-direction).

In this embodiment, the position adjustment system further comprises one position adjustment screw 275 for each position adjustment threaded hole 277.

In the example shown in the Figures, the locking system comprises a locking hole 286 and a locking screw 288 extending there-through. The locking hole 286 extends along an axis that is parallel to the longitudinal direction of the crossbeams 222, 224 and perpendicular to the axis of the position adjustment threaded hole 277.

The locking hole 286 comprises a movable portion 210, extending through the movable block 273, and a fixed portion 212, adjacent to the movable portion 210 along the axis of the locking hole 286 and extending through a portion of the rigidifying frame 221, and more particularly through the reception block 205. The fixed portion 212 is threaded. It has a diameter corresponding substantially to the diameter of the locking screw 288. The movable portion 210 is non-threaded. The dimension of the movable portion 210 in the direction of displacement of the movable block 273 is greater than the diameter of the locking screw 288. In the locked position, the locking screw 288 extends through the movable portion 210 and the free end of the locking screw 288 is screwed into the fixed portion 212 of the locking hole 286 until the head of the locking screw 288 bears against the movable block 273 so as to lock the position of the movable block 273 relative to the rigidifying frame 221.

Advantageously, each connector 270 according to the second embodiment is bidirectional. For this purpose, in the embodiment shown in FIGS. 6 and 7, the movable block 273 comprises an upper movable block 273 and a lower movable block 273. The connector block 205 further comprises an upper and a lower reception and guiding slots 206 respectively receiving the upper and lower movable blocks 273. As can be seen in FIG. 7, the upper reception and guiding slot 206 opens vertically upwards, while the lower reception and guiding slot 206 opens vertically downwards.

The rack according to a second embodiment is analogous to the rack according to the first embodiment, the only difference being the structure of the rigidifying frame 221 and connector 270 as described above with reference to FIGS. 6 and 7.

The assembly method of the rack according to the second embodiment is also analogous to the assembly method according to the first embodiment, the only difference being the structure of the rigidifying frame 221 and connector 270 as described above with reference to FIGS. 6 and 7.

In the subrack assembly 201 according to the second embodiment, the overall stiffness of the subrack 3 assembly in Y-direction is significantly increased thanks to the rigidifying frame 221 and connectors 270, thus resulting in a significant increase in the resonant frequencies in this direction as compared to a case in which no rigidifying frame 221 is provided. Therefore, with the subrack assembly 201 and rack according to the second embodiment, the risk of deterioration in the case of high dynamic oscillations is also reduced. The resistance in the Y-direction is, however, smaller than in the first embodiment, in particular due to the differences in the structures of the front and rear crossbeams in the second embodiment as compared to the first embodiment.

In particular, in this embodiment, the stiffness in the front to back direction (Y-direction) is increased thanks to the V-shaped reinforcing structure 231. In particular, the V-shaped reinforcing structure 231 forms a connection between the central zone, or even the middle of the reinforcing frame 221, which is the weakest area of the reinforcing frame 221 and the corners thereof, where the reinforcing frame 221 is attached to the vertical support structure of the rack frame 102. Thus, stresses are transferred through this V-shaped reinforcing structure 231 from the weaker central zone into the relatively strong vertical support structure 106 of the rack frame 102.

When it is present, the transversal strut 236 further increases the stiffness of the subrack assembly 201 in the Y-direction.

What is claimed is:

1. A subrack assembly configured to be mounted into an electronics rack, the subrack assembly comprising:
    a subrack configured for receiving electronic modules, the subrack comprising two top rails, two bottom rails and side elements, the top and bottom rails extending substantially parallel to one another and perpendicular to the side elements and connecting the side elements with each other;
    at least one rigidifying frame comprising a front crossbeam, a rear crossbeam and two side beams connecting the front crossbeam to the rear crossbeam at their respective longitudinal ends; and
    at least one connector for connecting the rigidifying frame to the top and/or to the bottom of the subrack, the connector comprising at least one movable block movable in translation relative to the rigidifying frame between an insertion position, in which the movable block is spaced away from the subrack and a use position, in which the movable block bears against the subrack,
    the or each connector being configured for connecting the rigidifying frame to the top and/or to the bottom of the subrack such that the front and rear crossbeams each extend substantially parallel to a top or bottom rail of the subrack and in alignment therewith along a vertical direction,
    the movable block being connected to the rigidifying frame in the insertion position.

2. The subrack assembly according to claim 1, wherein a distance between the front crossbeam and the rear crossbeam, taken perpendicular thereto, is greater than or equal to 90% of a distance between the top rails or the bottom rails of the subrack.

3. The subrack assembly according to claim 1, wherein the rigidifying frame further comprises at least one transversal strut, extending between the front crossbeam and the rear crossbeam, substantially perpendicular to the front and rear crossbeams and at a distance from the longitudinal ends of the front and rear crossbeams.

4. The subrack assembly according to claim 3, wherein one transversal strut of the at least one transversal strut is a central transversal strut extending from the middle of the front crossbeam to the middle of the rear crossbeam, the rigidifying frame further comprising two additional transversal struts extending between the front crossbeam and the rear crossbeam on either side of the central transversal strut.

5. The subrack assembly according to claim 1, wherein the connector comprises a position adjustment screw and a position adjustment threaded hole formed in the movable block, the movable block being movable between the insertion position and the use position by screwing the position adjustment screw into the adjustment threaded hole or out of the adjustment threaded hole.

6. The subrack assembly according to claim 1, wherein the connector further comprises a locking system, configured for locking the position of the movable block relative to the rigidifying frame, the locking system comprising a locking hole formed in the movable block and a locking screw.

7. The subrack assembly according to claim 1, wherein each connector comprises an upper movable block of the at least one movable block and a lower movable block of the at least one movable block, the upper movable block and the lower movable block independently movable relative to the rigidifying frame in opposite directions, the upper movable block being configured for bearing against a bottom rail of a subrack located above the rigidifying frame in the use position of the upper movable block and the lower movable block being configured for bearing against a top rail of a subrack located below the rigidifying frame.

8. The subrack assembly according to claim 1, wherein each movable block is substantially L-shaped and comprises a foot portion comprising a bearing surface configured for bearing against a corresponding surface of the subrack in the use position, and a leg portion extending substantially perpendicular to the foot portion, the leg portion bearing against a wall of the rigidifying frame.

9. The subrack assembly according to claim 1, wherein the front crossbeam and/or the rear crossbeam comprises a tubular outer wall having a closed cross-section.

10. The subrack assembly according to claim 9, wherein the front crossbeam and/or the rear crossbeam comprises at least one reinforcing rib extending inside the tubular outer wall.

11. The subrack assembly according to claim 10, wherein the or each reinforcing rib extends diagonally between two diagonally opposed corners of the tubular outer wall.

12. The subrack assembly according to claim 9, wherein the front crossbeam and/or the rear crossbeam comprises two reinforcing ribs extending diagonally between diagonally opposed corners of the tubular outer wall so as to form a cross when viewed in cross-section perpendicular to the longitudinal direction of the corresponding crossbeam.

13. The subrack assembly according to claim 1, further comprising a substantially V-shaped reinforcing structure extending from the front crossbeam to the rear crossbeam.

14. The subrack assembly according to claim 13, wherein the substantially V-shaped reinforcing structure comprises a first diagonal strut extending from a central region of a first one among the front and the rear crossbeam to a first longitudinal end of the other one among the front and the rear crossbeam and a second diagonal strut extending from a central region of the first one among the front and the rear crossbeam to the second longitudinal end of the other one among the front and the rear crossbeam.

15. The subrack assembly according to claim 2, wherein the distance between the front crossbeam and the rear crossbeam, taken perpendicular thereto, is smaller than or equal to the distance between the top rails or the bottom rails of the subrack.

16. A rack comprising:
    a rack frame; and
    at least one of the subrack assembly according to claim 1.

17. The rack according to claim 16, wherein the rack frame defines reception spaces each configured for receiving one of the subracks of the subrack assembly and reception zones, each reception zone being configured for receiving one of the rigidifying frames of the subrack assembly, the reception spaces and reception zones being arranged in alternating fashion along the vertical direction on the rack frame and wherein the rack comprises at least one of the subracks of the subrack assembly mounted in one of the reception spaces and at least one of the rigidifying frames of the subrack assembly mounted in the reception zone adjacent to the subrack above or below the subrack.

18. The rack according to claim 17, wherein the movable block of the or each connector of the subrack assembly occupies the use position in which the movable block bears against the subrack.

19. The rack according to claim 16, wherein, for the or each subrack, the rack comprises one of the rigidifying frames connected to the top of the subrack and one of the rigidifying frames connected to the bottom of the subrack through respective one of the connectors, the movable block of the or each connector being in the use position in which the movable block bears against the subrack.

20. The rack according to claim 19, comprising at least two of the subracks mounted in adjacent reception spaces of the reception spaces of the rack frame, a common rigidifying frame being arranged in the reception zone located between the subracks, the common rigidifying frame being connected both to the upper and to the lower subrack through the connectors, the movable block of the or each connector being in the use position in which the movable block bears against a corresponding one of the subracks.

21. A method for assembling the rack according to claim 16 comprising the steps of:
    providing the rack frame comprising reception spaces and reception zones;
    mounting the subrack and the rigidifying frame, respectively in one of the reception spaces and in an adjacent one of the reception zones of the rack frame, located above or below the one reception space, the movable block of each connector being in the insertion position; and
    displacing the movable block of the or each connector from the insertion position to the use position so that the movable block bears against the corresponding subrack.

22. The subrack assembly according to claim 1, wherein the movable block is rigid.

* * * * *